United States Patent [19]

Takagi et al.

[11] Patent Number: 5,216,271
[45] Date of Patent: Jun. 1, 1993

[54] BICMOS DEVICE WITH LOW BANDGAP CMOS CONTACT REGIONS AND LOW BANDGAP BIPOLAR BASE REGION

[75] Inventors: Shinichi Takagi, Tokyo; Tomohisa Mizuno, Yokohama, both of Japan

[73] Assignee: Kabushiki Kaisha Toshiba, Kawasaki, Japan

[21] Appl. No.: 766,221

[22] Filed: Sep. 27, 1991

[30] Foreign Application Priority Data

Sep. 28, 1990 [JP] Japan ................... 2-256961

[51] Int. Cl.⁵ ............... H01L 29/163; H01L 29/165; H01L 29/70; H01L 29/78
[52] U.S. Cl. ................................. 257/370; 257/191; 257/192; 257/197
[58] Field of Search ............... 357/23.1, 67, 16, 65

[56] References Cited

U.S. PATENT DOCUMENTS

| | | | |
|---|---|---|---|
| 4,521,794 | 6/1985 | Murase et al. | 357/67 |
| 4,728,998 | 3/1988 | Strain | 357/23.1 |
| 5,089,872 | 2/1992 | Ozturk et al. | 357/67 |

FOREIGN PATENT DOCUMENTS

| | | | |
|---|---|---|---|
| 62-76550 | 4/1987 | Japan | 357/67 |
| 63-13378 | 1/1988 | Japan. | |
| 63-13379 | 1/1988 | Japan. | |

*Primary Examiner*—Jerome Jackson, Jr.
*Attorney, Agent, or Firm*—Oblon, Spivak, McClelland, Maier & Neustadt

[57] ABSTRACT

According to the present invention, a control gate is formed on an n-type Si substrate, and a p-type source-drain region is formed in the surface of the substrate on both the sides of the control gate. A p-type $Si_xGe_{1-x}$ ($0 \leq x < 1$) layer and an Al electrode are sequentially formed in the source-drain region. The energy difference between the valence band of the SiGe layer and a vacuum level is smaller than the energy difference between the valence band of an Si layer constituting the source-drain region and the vacuum level, and the energy difference of the conduction band of the SiGe layer and the vacuum level is larger than the energy difference of the conduction band of the Si layer and the vacuum level. For this reason, a Schottky barrier height is decreased, and resistances between the semiconductor layers and the Al electrode are reduced.

10 Claims, 11 Drawing Sheets

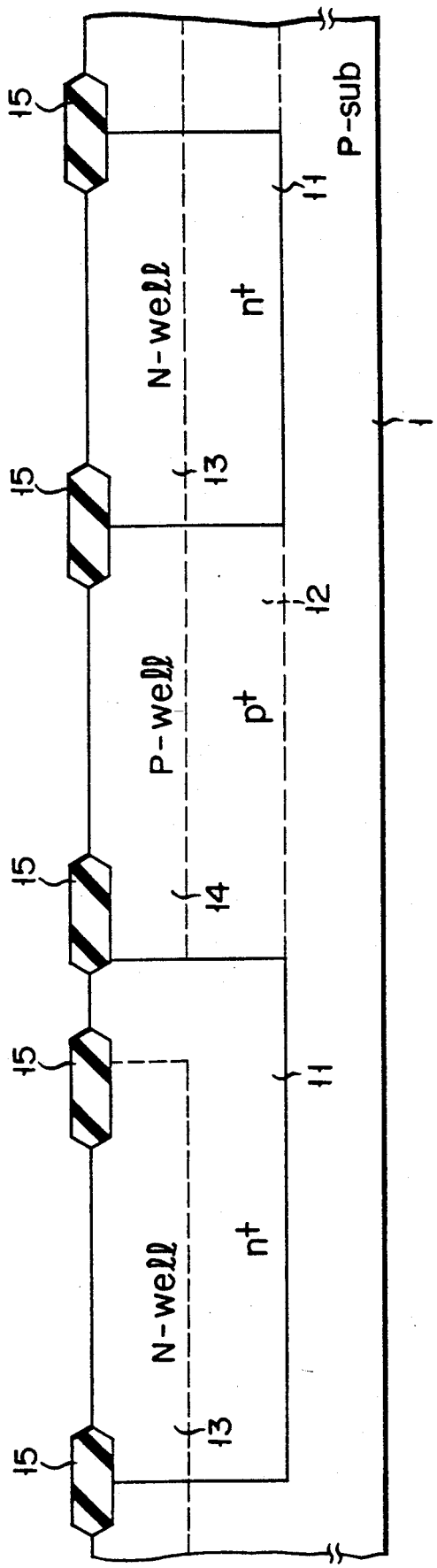
F I G. 3A

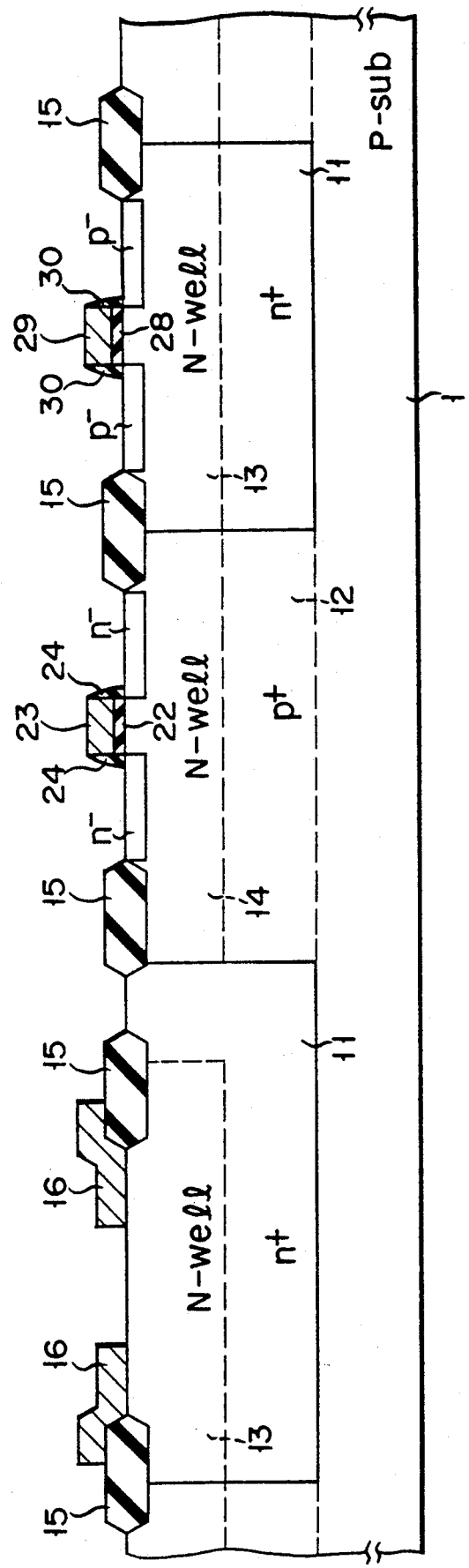
F I G. 3B

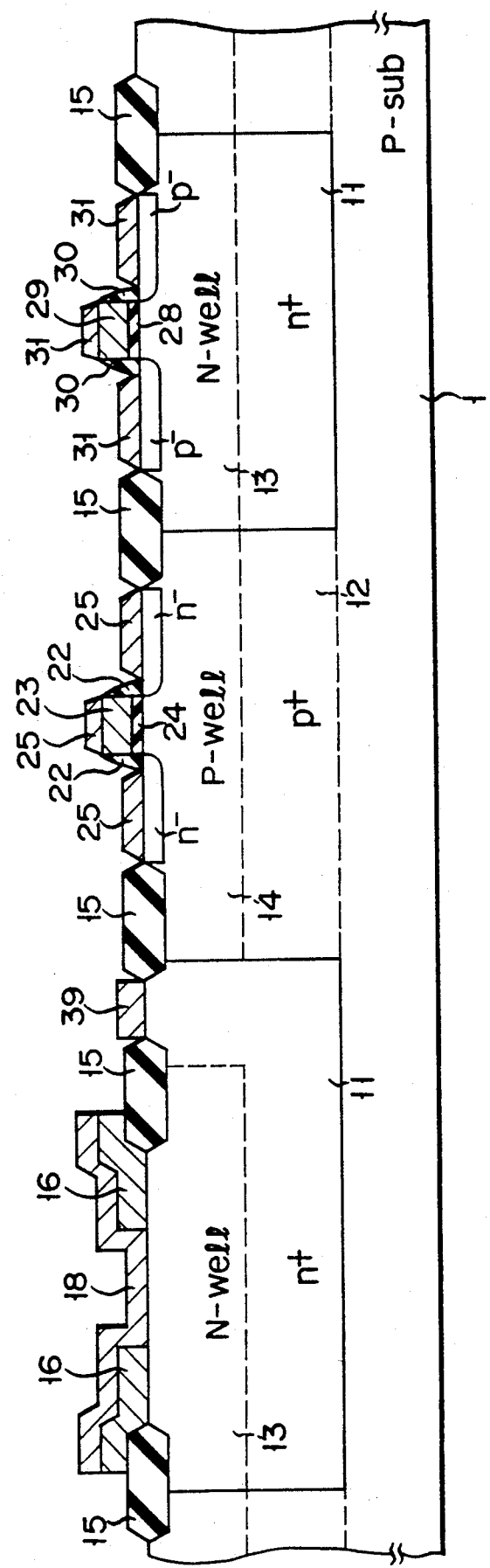
F I G. 3C

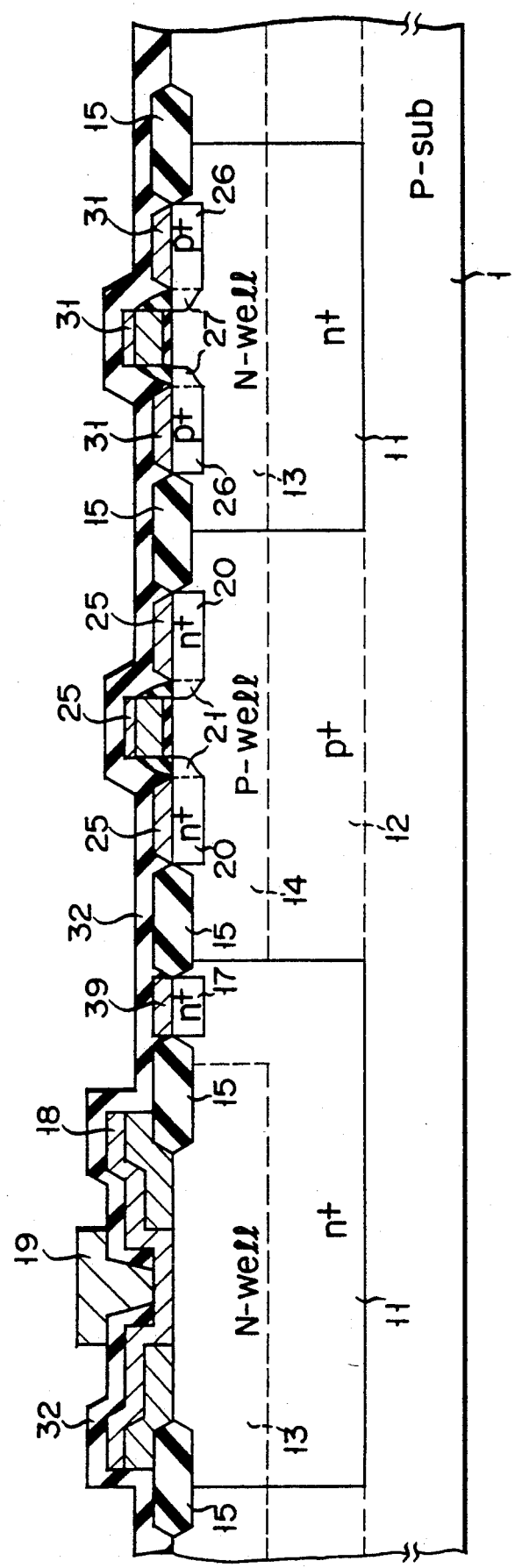
F I G. 3E

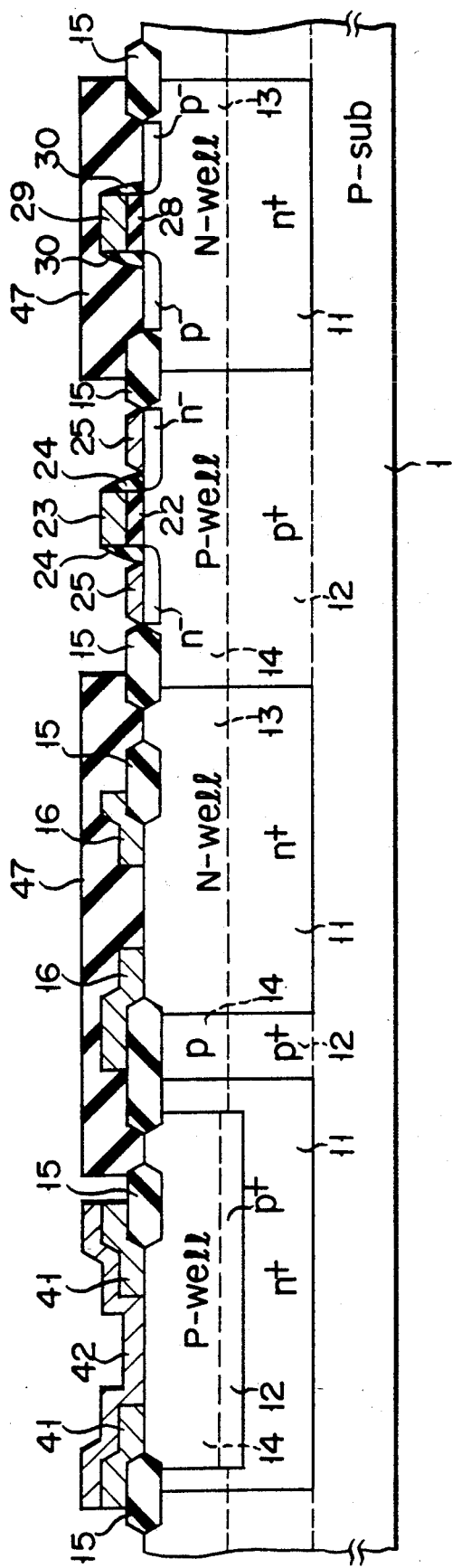
F I G. 5A

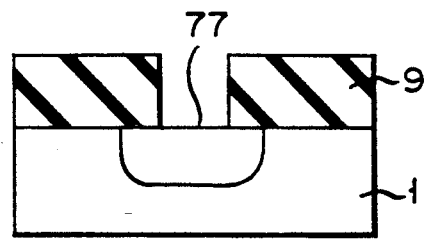
F I G. 6A
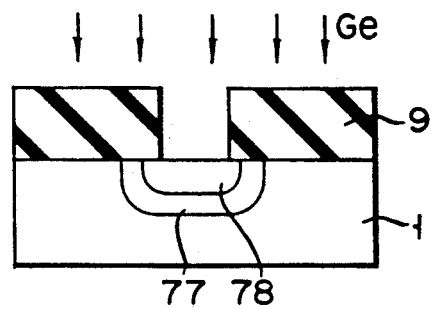
F I G. 6B
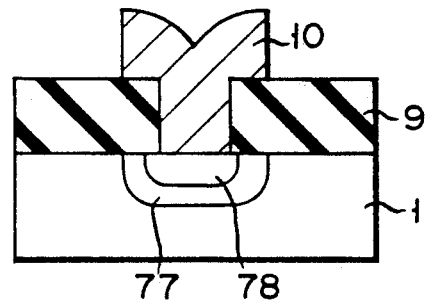
F I G. 6C
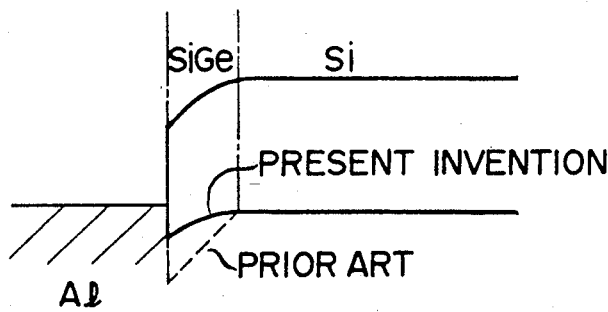
F I G. 7

BICMOS DEVICE WITH LOW BANDGAP CMOS CONTACT REGIONS AND LOW BANDGAP BIPOLAR BASE REGION

BACKGROUND OF THE INVENTION

1. Field of the Invention

The present invention relates to a semiconductor device having improved contact characteristics between a semiconductor layer and a metal electrode.

2. Description of the Related Art

A high-density, high-performance MOS integrated circuit formed on an Si substrate is conventionally attained by micropatterning elements. More specifically, it is very important to decrease the gate length of a field effect transistor (FET) in order to not only decrease the element area but also improve the current driving force and the operation speed of the element. In this case, although the junction depth of a diffusion layer must be decreased to prevent a short-channel effect, a decrease in thickness of the diffusion layer is limited.

The ON-resistance of a MOSFET is determined by not only the channel resistance but also a sum of parasitic resistances such as the diffusion layer resistance of a source-drain region and the contact resistance between a metal and the source-drain region. Therefore, even when the junction depth of the diffusion layer is maximally decreased, when the channel resistance becomes equal to the parasitic resistance by micropatterning, a further increase in driving force cannot be expected, and the operation speed is not improved.

In a conventional FET, the thickness of a diffusion layer of a source-drain region is decreased. However, even when the thickness of the diffusion layer is maximally decreased, there is a large contact resistance between the source-drain region and a metal electrode. For this reason, an increase in driving force of the FET cannot be expected, and the operation speed cannot increased.

SUMMARY OF THE INVENTION

The present invention has been made in consideration of the above problems, and has as its object to improve an operation speed of an FET by reducing a contact resistance and, in a broader sense, to improve characteristics of all semiconductor devices exhibiting characteristic degradation due to the contact resistance.

According to the first aspect of the present invention, a semiconductor device comprises a p-type first semiconductor layer, a p-type second semiconductor layer formed on a surface of the first semiconductor layer, and a metal electrode formed on a surface of the second semiconductor layer, wherein an energy difference between a valence band of the second semiconductor layer and a vacuum level is smaller than an energy difference between a valence band of the first semiconductor layer and the vacuum level.

According to the second aspect of the present invention, a semiconductor device comprises an n-type first semiconductor layer, an n-type second semiconductor layer formed on a surface of the first semiconductor layer, a metal electrode formed on a surface of the second semiconductor layer, wherein an energy difference between a conduction band of the second semiconductor layer and a vacuum level is larger than an energy difference between a conduction band of the first semiconductor layer and the vacuum level.

According to the present invention, a barrier height between the first and second semiconductor layers and a Schottky barrier height between the second semiconductor layer and the metal electrode are lower than a Schottky barrier height between a semiconductor layer and a metal electrode of a conventional structure. That is, since there is no extremely high barrier height, the resistances between the semiconductor layers and the metal electrode can be easily decreased. In addition, since the hetero semiconductor material used have small effective masses, a tunnel current flowing through the Schottky barrier can be further increased. For this reason, the resistances between the semiconductor layers and the metal electrode can be further decreased.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 3A to 3E are sectional views showing manufacturing steps of the BICMOS shown in FIG. 2;

FIGS. 5A and 5B are sectional views showing manufacturing steps of the device shown in FIG. 4;

FIGS. 6A to 6C are sectional views showing the structure of a device according to the fourth embodiment of the present invention;

FIG. 7 is a band diagram of the structure of the fourth embodiment; and

DETAILED DESCRIPTION OF THE PREFERRED EMBODIMENTS

Figure 1A:
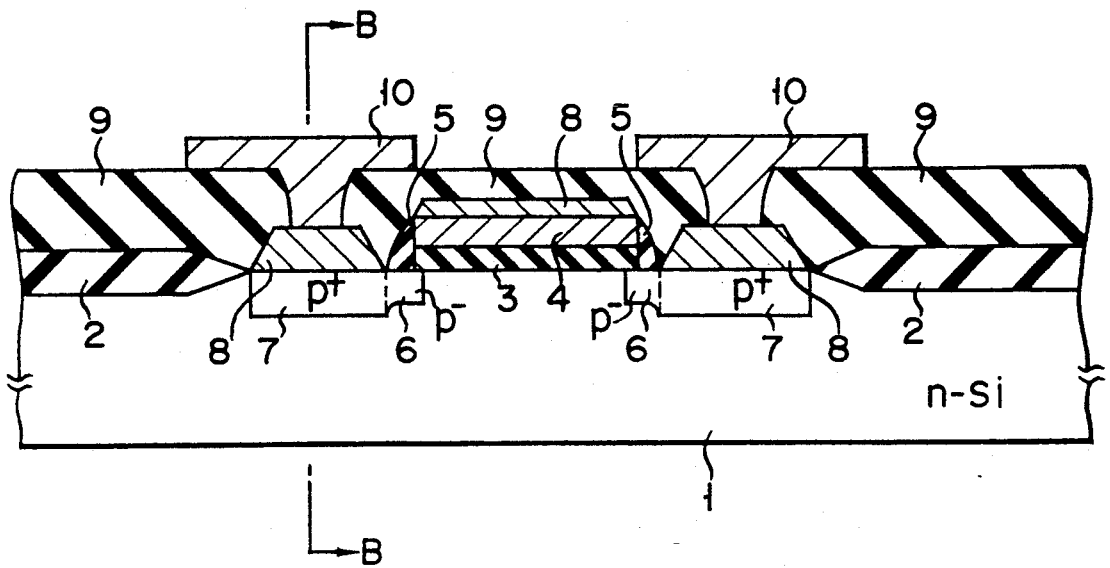
FIG. 1A is a sectional view showing a p-channel MOSFET according to the first embodiment of the present invention.

According to the first embodiment of the present invention shown in FIG. 1A, an element isolation oxide film 2 is formed on an n-type silicon substrate 1, and a silicon gate electrode 4 of a p-channel MOSFET is formed on a gate insulating film 3. Side-wall silicon oxide films 5 are arranged on both sides of the gate electrode 4, and p-type LDD (Lightly Doped Drain) regions 6 and highly-doped p-type source-drain regions 7 are formed in self-alignment with these side-wall silicon oxide films 5. Highly-doped p-type silicon-germanium alloy or germanium thin films 8 are formed on the source-drain regions 7 and the gate electrode 4. In addition, a substrate portion on which the MOSFET is formed is covered with an insulating interlayer 9, and the insulating interlayer 9 has openings on the silicon-germanium alloy or germanium thin films 8 such that metal electrodes 10 are formed to be in contact with the thin films 8.

Figure 1B:
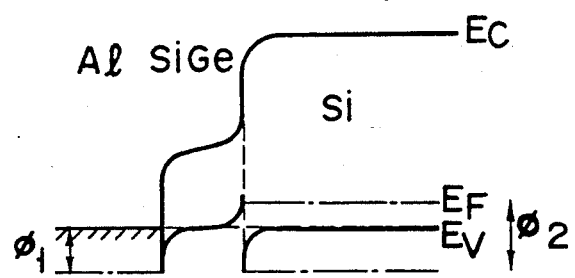
FIG. 1B is a band diagram along a line B—B in FIG. 1A.
Figure 8:
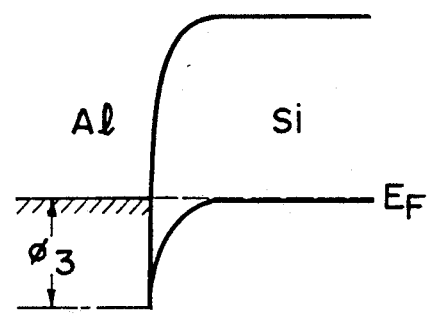
FIG. 8 is a band diagram corresponding to FIG. 1B in a conventional structure.

FIG. 1B is a band diagram of a section along a line B—B from the source-drain electrode to the Si substrate. For the purpose of comparison, FIG. 8 shows a band diagram of a MOSFET having a conventional structure which has no SiGe layer. As is apparent from these diagrams, according to this embodiment, a Schottky barrier height $\phi_1$ for holes between the Al electrode and the SiGe layer and a barrier height $\phi_2$ for holes between the SiGe layer and the Si layer are set to be lower than a Schottky barrier height $\phi_3$ for holes between an Al electrode and an Si layer in the conventional structure.

These barrier height relationships are obtained for the following reason. The energy difference between a vacuum level and the conduction band of the SiGe layer (the second semiconductor layer) is larger than that between the vacuum level and the conduction band of the Si layer (the first semiconductor layer), and the energy difference between the vacuum level and the valence band of the SiGe layer is set to be smaller than that between the vacuum level and the valence band of the Si layer.

This relationship between the valence band and the conduction band need only be satisfied in bands in which majority carriers are moved.

When the above conditions are satisfied, the following effects can be obtained.

According to the first embodiment, since the source-drain region 7 formed on the surface of the silicon substrate is in contact with the metal electrode 10 through a hetero semiconductor such as germanium or a silicon-germanium alloy having a forbidden band narrower than that of silicon, Schottky barrier heights can be kept to be low on an interface between the metal and the hetero semiconductor and an interface between the source-drain region and the hetero semiconductor. In addition, these materials have small effective masses, and a tunnel current can be increased, thereby decreasing contact resistances at these interfaces. Since the mobility of carriers in the hetero semiconductor is larger than that in silicon, the diffusion layer resistance is reduced. For these reasons, the ON-resistance of the transistor is decreased by a decrease in parasitic resistance, and the transistor can be operated at higher speed.

Since a silicon-germanium alloy $Si_xGe_{1-x}(0 \leq x < 1)$ can be easily epitaxially-grown on the substrate silicon, the silicon-germanium alloy has preferable interface characteristics and does not greatly increase the diffusion layer resistance. When the composition of the epitaxial layer is predetermined, except when a condition of $x=1$ is satisfied, a strained epitaxial layer is formed, and the growth thickness of the layer is limited. In this case, the condition of $x=1$ is satisfied on the interface, and the value of x is gradually decreased as the epitaxial layer is grown, i.e., a so-called graded gap structure can be employed.

Figure 2:
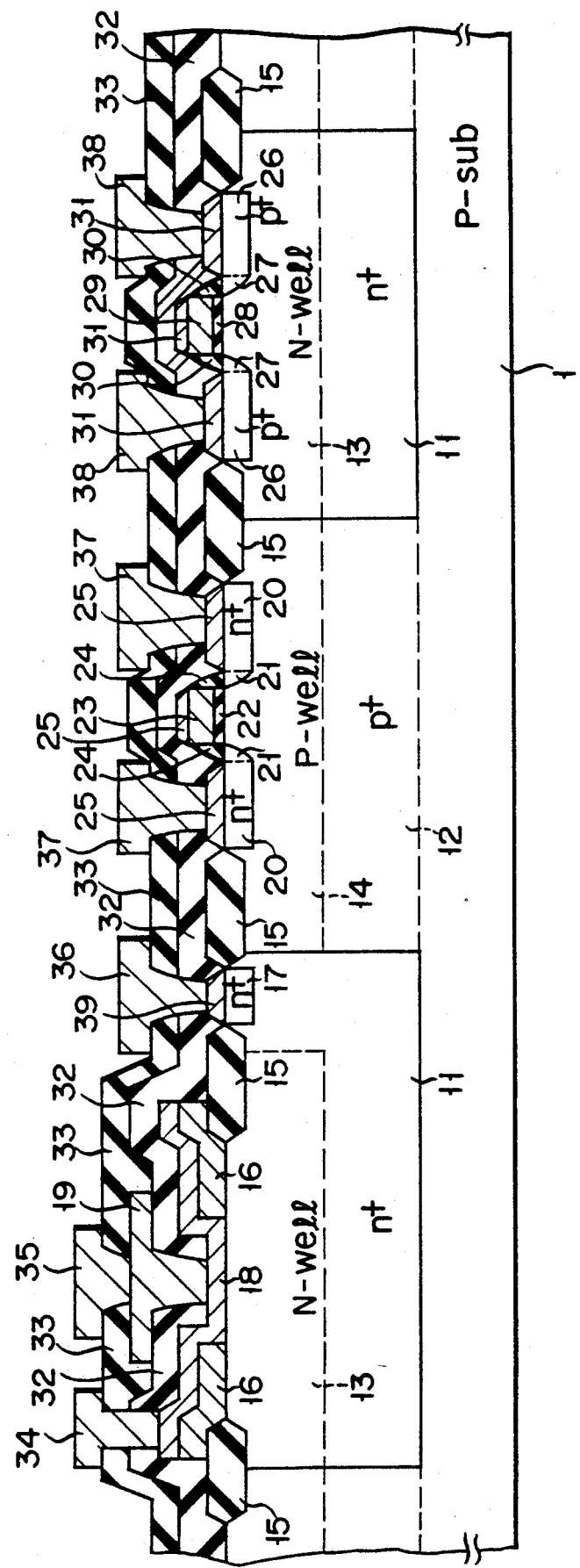
FIG. 2 is a sectional view showing a BICMOS according to the second embodiment of the present invention.

The second embodiment of the present invention will be described below with reference to FIG. 2. In the second embodiment, the same reference numerals as in FIG. 1A denote the same parts as FIG. 2, and a description thereof will be omitted.

Similar to a conventional BICMOS structure, in a p-type silicon substrate 1, highly-doped n-type buried layers 11, a highly-doped p-type buried layer 12, n-type well layers 13, and a p-type well layer 14 are formed. Element isolation oxide films 15 isolate the regions of an n-channel MOSFET, a p-channel MOSFET, and an npn bipolar transistor from each other. The npn bipolar transistor comprises a collector-contact region 17 constituted by a diffusion region, a p-type silicon-germanium alloy or germanium thin film 18 serving as a prospective base-extraction p-type polysilicon layer 16, and an emitter extraction n-type polysilicon layer 19.

The n-channel MOSFET comprises n-type source-drain regions 20 constituted by a highly-doped diffusion region, n-type LDD regions 21, a gate insulating film 22, a highly-doped n-type polysilicon gate electrode 23, side-wall oxide films 24, and highly-doped n-type silicon-germanium alloy or germanium thin films 25.

The p-channel MOSFET comprises p-type source-drain regions 26 constituted by a highly-doped diffusion region, p-type LDD regions 27, a gate insulating film 28, a highly-doped p-type polysilicon gate electrode 29, side-wall oxide films 30, and highly-doped p-type silicon-germanium alloy or germanium thin films 31.

The substrate is covered with insulating films 32 and 33, and the insulating films 32 and 33 have openings on the silicon-germanium alloy or germanium thin film 18, the n-type polysilicon emitter 19, and the silicon-germanium alloy or germanium thin films 25, 31, and 39. In these openings, a base metal electrode 34, an emitter metal electrode 35, a collector metal electrode 36, an n-channel source-drain metal electrode 37, and a p-channel MOSFET source-drain metal electrode 38 are respectively formed.

FIGS. 3A to 3E are sectional views showing manufacturing steps of the BICMOS. The manufacturing steps will be described below with reference to these sectional views.

Similar to a step of manufacturing a conventional BICMOS integrated circuit, the p-type buried layer 12 and the n-type buried layers 11 are formed in the silicon substrate 1, and these layers are epitaxially grown to form the p-type well layer 14 and the n-type well layers 13. Thereafter, the element isolation oxide films 15 are formed to isolate the elements from each other (FIG. 3A).

In the MOSFET transistor regions, the gate insulating films 22 and 28 are formed by thermal oxidation to have a thickness of about 100 Å each, and the entire surface of the substrate is subjected to patterning of a polysilicon film deposited by a vapor deposition (CVD) method. High-concentration n-type ions are implanted in the polysilicon film in the n-channel MOSFET element region, and high-concentration p-type ions are implanted in the polysilicon films in the p-channel MOSFET element region and the npn bipolar transistor element region. Thereafter, the polysilicon film of the MOSFET region is patterned, and the polysilicon is etched by a reactive ion etching (RIE) method, thereby forming the gate electrodes 23 and 29 of polysilicon. In addition, n-type LDD ions are implanted in the n-channel MOSFET element region, and p-type LDD ions are implanted in the p-channel MOSFET element region. After the silicon oxide film is deposited by a CVD method, the oxide film is etched back to form the side-wall oxide films 24 and 30 of the MOSFETs. Thereafter, the polysilicon film on the npn-bipolar transistor is patterned to form the base-extraction p-type silicon layer 16 (FIG. 3B).

The silicon-germanium alloy or germanium thin films 18, 25, 31, and 39 are selectively grown on the silicon and polysilicon films by a vapor epitaxial growth method to have a thickness of 500 to 1,000 Å each. At this time, an SiH$_4$ (monosilane) or GeH$_4$ (german) gas is used as a source gas, and B$_2$H$_6$ (diborane) gas is added to the source gas for p-type doping. In this case, the concentration of boron is set to be about $10^{19}$ cm$^{-3}$ (FIG. 3C).

Figure 3D:
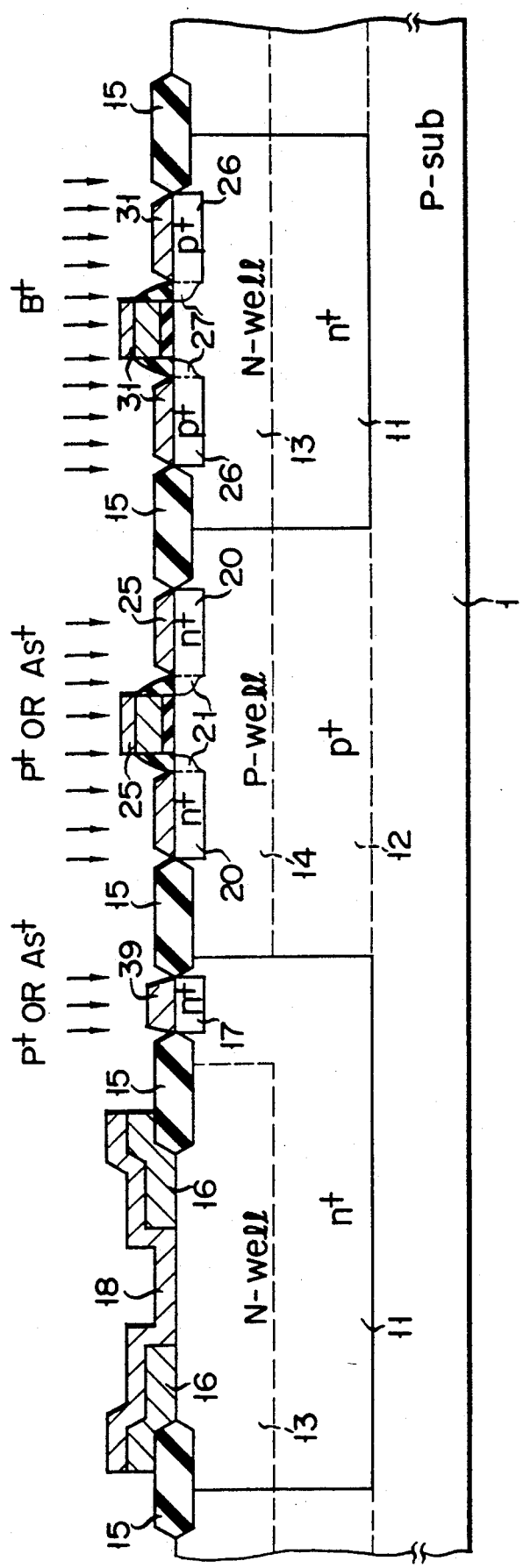

Thereafter, e.g., arsenic or phosphorus ions are doped in the n-channel MOSFET, and, e.g., boron ions are implanted in the p-channel MOSFET, thereby forming highly-doped impurity source-drain regions 20 and 26. At this time, the p-n junctions of the source-drain regions of the MOSFETs are formed in the substrate silicon. At the same time, arsenic or phosphorus ions are doped in the collector-contact region 17 of the npn bipolar transistor. Thereafter, activation annealing is performed at a temperature of 1,000° C. for 30 minutes by a rapid lamp heating method (FIG. 3D).

After the silicon oxide film 32 is deposited by a CVD method, an opening is formed in a part of the silicon oxide film 32 on the silicon-germanium alloy or germanium thin film 18 serving as the prospective base of the bipolar transistor. An n-type polysilicon film is deposited in the bipolar transistor region by a CVD method and patterned to form the emitter region 19 of the bipolar transistor (FIG. 3E).

Thereafter, the silicon oxide film 33 is deposited on the resultant structure by a CVD method and patterned again, and a metal thin film such as an aluminum film is deposited on the resultant structure by a sputtering method. In addition, the metal thin film is patterned to form the base electrode 34, emitter electrode 35, collector electrode 36 of the bipolar transistor, the source-drain electrode 37 and gate electrode of the n-channel MOSFET, and the source-drain electrode 38 and the gate electrode of the p-channel MOSFET, thereby completing a BICMOS (FIG. 2).

According to the second embodiment, the same effect as described in the first embodiment can be obtained, and a silicon-based hetero bipolar transistor having an Si$_x$Ge$_{1-x}$ layer as a base region and promising as a high-speed element in a micropatterned region can be easily integrated with a CMOSFET. In addition, since a so-called BICMOS arrangement is employed, a semiconductor device capable of performing a high-speed operation can be provided.

Figure 4:
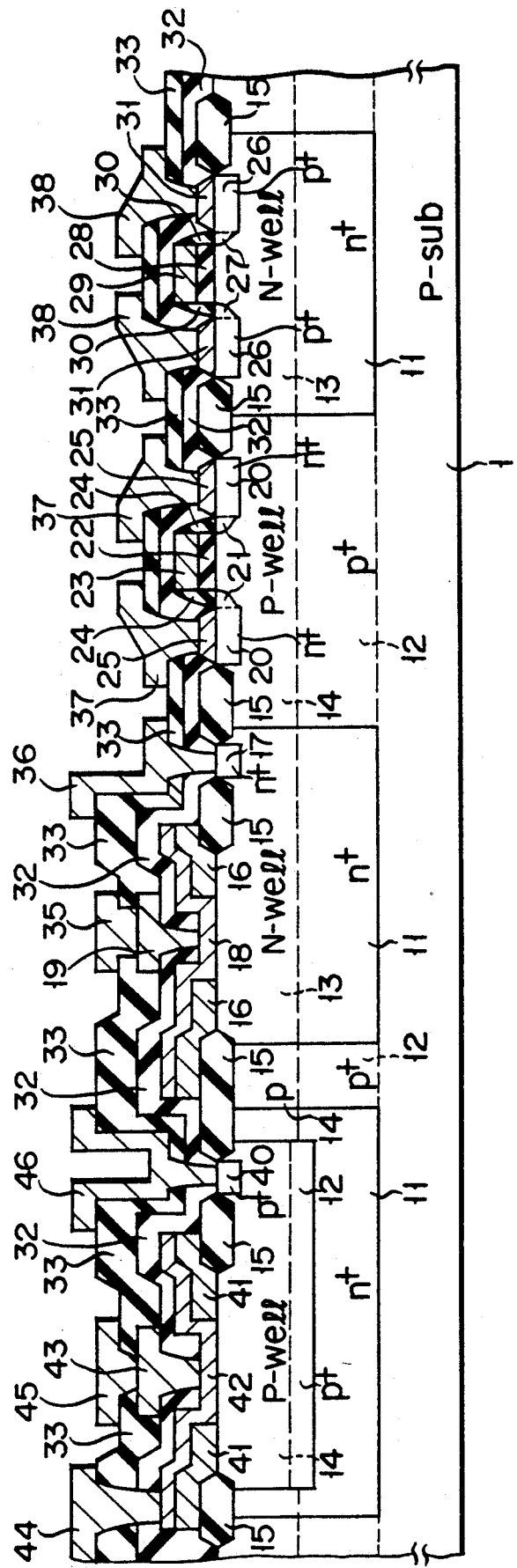
FIG. 4 is a sectional view showing a device according to the third embodiment of the present invention, wherein the device has a structure obtained by adding an npn bipolar transistor to the BICMOS of the second embodiment.

The third embodiment of the present invention will be described below with reference to FIG. 4.

In the third embodiment, a structure obtained by adding a pnp bipolar transistor to the BICMOS of the second embodiment is employed. A pnp bipolar transistor comprises a collector-contact region 40, base-extraction n-type polysilicon films 41, an n-type silicon-germanium or germanium thin film 42 serving as a prospective base, a p-type polysilicon emitter 43, a base metal electrode 44, an emitter metal electrode 45, and a collector metal electrode 46.

Figure 5B:
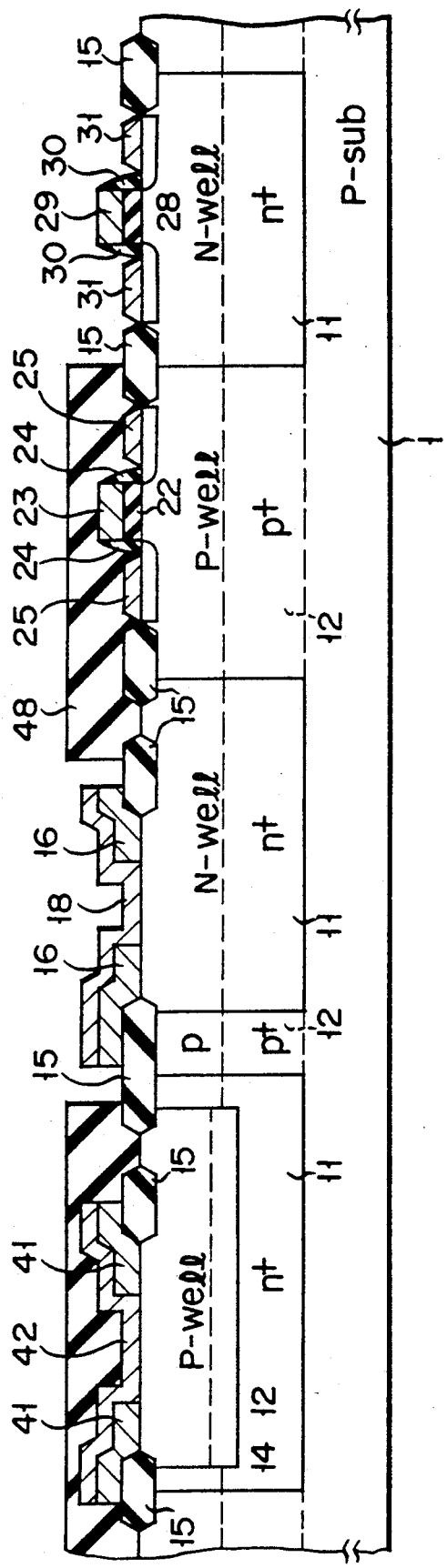

Main steps of manufacturing the BICMOS having the above structure are shown in FIGS. 5A and 5B.

The manufacturing steps of the BICMOS are similar to those of the BICMOS according to the second embodiment. In the third embodiment, since the npn bipolar transistor and the pnp bipolar transistor must be integrated with each other, p- and n-type silicon-germanium alloy or germanium thin films are independently epitaxially-grown.

That is, after the step shown in FIG. 3B, the element regions of the npn bipolar transistor and the p-channel MOSFET are covered with insulating films 47 such as silicon oxide films, and n-type silicon-germanium alloy or germanium thin films 42 are grown in the source-drain regions of the pnp bipolar transistor and the n-type MOSFET (FIG. 5A).

Thereafter, the element regions of the pnp bipolar transistor and the n-channel MOSFET are covered with insulating films 48 such as silicon oxide films, and p-type silicon-germanium alloy or germanium thin films 18 are grown in the source-drain regions of the npn bipolar transistor and the p-channel MOSFET (FIG. 5B).

As the following steps, the steps shown in FIG. 3E and thereafter can be applied. The method of independently epitaxially-growing the n- and p-type silicon-germanium alloy or germanium thin films can be applied as the manufacturing method of the second embodiment.

Therefore, according to the third embodiment, the same effect as described in the second embodiment can be obtained. That is, according to the third embodiment, in an integrated circuit constituted by a complementary MOSFET or a bipolar transistor and a complementary MOSFET, the diffusion layer resistance of a source-drain region and the contact resistance between the metal electrode and the source-drain region in the MOSFET can be decreased, and even in a micropatterned MOSFET, a high current driving force and a high-speed operation can be obtained.

The fourth embodiment of the present invention will be described below with reference to FIG. 6.

The above silicon-germanium layer can also be obtained by ion implantation. That is, BF$_2^+$ ions are implanted in an n-type silicon substrate 1 to form a p$^+$-type layer 77 having a surface concentration of $1 \times 10^{20}$ cm$^{-3}$. Thereafter, a CVD-SiO$_2$ film 9 is formed on the resultant structure and patterned to form a contact hole (FIG. 6A).

Thereafter, Ge$^+$ ions are implanted in the resultant structure to form an Si$_x$Ge$_{1-x}$ layer 78 having a surface concentration of about $2 \times 10^{22}$ cm$^{-3}$. In addition, the Si$_x$Ge$_{1-x}$ layer 78 is annealed to set a gradient in the Ge concentration of the layer 78. This is a kind of thermal diffusion (FIG. 6B).

Aluminum is deposited on the resultant structure and patterned to form a contact electrode 10 (FIG. 6C).

Although the Si$_x$Ge$_{1-x}$ layer 78 is formed on the surface of the p$^+$-type layer 77, the Si$_x$Ge$_{1-x}$ layer 78 may be formed on the surface of an n$^+$-type layer. In addition, the peak concentration of Ge is preferably set to be $1 \times 10^{21}$ cm$^{-3}$ or more. This concentration is required to obtain an effect of a decrease in band gap.

According to this embodiment, since the number of Ge atoms is about half the number of Si atoms on the surface of the p$^+$-type layer 77, an SiGe mixed-crystal semiconductor layer is obtained, thereby decreasing the band gap by about 0.4 eV. Therefore, the band gap of a contact portion of the p$^+$-type layer can reduce the Schottky barrier to 0.18 eV, as shown in FIG. 7.

Since the Ge concentration has a gradient, no energy gap is generated between the Si$_x$Ge$_{1-x}$ layer and the Si layer. Therefore, when the Ge concentration becomes uniform, a barrier is not generated by an energy gap of about 0.2 eV between the Si layer and the Si$_x$Ge$_{1-x}$ layer, and a contact resistance of only a Schottky barrier of about 0.18 eV is generated between the Al film and the $Si_xGe_{1-x}$ layer. Therefore, according to the present invention, it is expected that a contact resistance can be reduced to one one-hundredth or less of a contact resistance obtained by a conventional device.

In the above embodiment, although BF2 and Ge ions are sequentially implanted in the Si substrate, this order may be reversed. In place of the BF2 ions, impurities such as B or P ions having conductivity in the Si substrate may be used.

When the present invention is examined in detail, the above embodiments can be modified as follows.

(1) The substrate is not limited to a monocrystalline silicon substrate, and semiconductors other than Si, e.g., Ge or C (diamond) of Group IV, and a compound semiconductor, e.g., GaAs or InP, may be used. In addition, as the substrate used in the above embodiments, SOI and SOS substrates using a semiconductor layer formed on an insulating film or an insulating monocrystalline substrate may be used.

(2) The same type of semiconductors need not be used for the substrate and a semiconductor layer formed on the surface thereof, and different types of semiconductors may be used to form a hetero junction. For example, an Si layer may be formed on the surface of a Ge substrate, and a GaAs layer may be formed on an Si substrate.

(3) A barrier metal such as TiN may be interposed between the SiGe layer and the Al wiring to prevent Al diffusion into the SiGe layer.

(4) The wiring material is not limited to Al, but may be monocrystalline Al, an Al-based alloy such as Al-Si or Al-Si-Ge, refractory metal or silicide of the metal such as Mo, W, N, Co, Ti, molybdenum silicide, or tungsten silicide. Materials other than these materials, e.g., Cu or a Cu-based alloy may be used. In addition, not only metals but also semiconductors such as impurity-doped polysilicon may be used as the wiring material.

(5) The Si layer and the SiGe layer which form a hetero junction preferably have the same conductivity type. When an n-type SiGe layer is used, an impurity or the like is selected such that the conduction band of the Si layer is lower than that of the SiGe layer. When a p-type SiGe layer is used, an impurity is selected such that the valence band of the SiGe layer is higher than that of the Si layer.

In addition, even when other materials are used in place of SiGe and Si, when the above relationship is held, the same effect as described in the above embodiments can be obtained.

(6) The concentration of Ge ions in the SiGe layer is preferably set to be lower on the Si side and higher on the Al wiring side, and the Ge concentration may have a peak at an intermediate position of the SiGe layer. This SiGe layer can be obtained as follows. For example, Si and Ge monatomic layers are sequentially formed on an Si layer, Si and Ge diatomic layers are sequentially formed on the resultant structure, and other atomic layers are formed in this order while increasing the atom number of the layers. As a result, the SiGe layer is formed.

(7) The control gate of an FET is not limited to a MOS electrode, and a MIS electrode or a junction electrode such as a Schottky junction electrode may be used as the control gate.

(8) A semiconductor device to which the present invention is applied is not limited to an FET, and the present invention may be applied to a device such as a diode or a resistor to which a large current flows.

(9) When the BICMOS is formed by a single film, the SiGe layer preferably has a thickness between 100 Å and 2,000 Å and, more preferably, has a thickness between 500 Å and 1,000 Å. This is for the following reasons. When the SiGe layer has a thickness smaller than 100 Å, a plurality of FETs and bipolar transistors cannot be formed on a single substrate to have uniform characteristics. When the SiGe layer has a thickness larger than 2,000 Å, the crystallinity of the SiGe layer is degraded. Therefore, a BICMOS having preferable characteristics cannot be formed.

(10) Disilanesiliconfluoride may be used in place of silane to form the SiGe layer by a selective CVD method. The SiGe layer may be formed by a molecular-beam epitaxial method or an alloying method in addition to the selective CVD method. According to the alloying method, after Ge is deposited on the surface of an Si layer, Ge ions are thermally diffused in the Si layer by annealing, thereby forming the SiGe layer.

(11) In the above embodiments, the Si layer and the SiGe layer are used as the first and second semiconductor layers, respectively. In addition to this combination between the first and second semiconductors, the following combinations are appropriate in the present invention: (Si and InAs), (Si and InSb), (SiGe and Ge), (Ge and GeSn), (GaAs and Ge), (InP and GeSn), (InP and InGaAs), (InP and PbS), (SiC and Si), and (InAs and PbSnSe).

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor device comprising:

a substrate made of a first semiconductor material;

first, second and third regions each including a semiconductor material, formed on the substrate, and isolated from each other by element isolation oxide films;

a bipolar transistor formed in the first region, and having a collector formed in the substrate, a base constituted by a first film made of a second semiconductor material and formed on the substrate, and an emitter constituted by a semiconductor film formed on the first film;

a n-channel MOSFET formed in the second region, and having n-type source and drain regions formed in a p-type region of the substrate, an n-type second film made of a semiconductor material having a composition substantially the same as that of the second semiconductor material and formed on each of the n-type source and drain regions, and a metal electrode formed on the second film, wherein an energy difference between a conduction band of the second film and a vacuum level is larger than an energy difference between a conduction band of the n-type source and drain regions and the vacuum level; and a p-channel MOSFET formed in the third region, and having p-type source and drain regions formed in an n-type region of the substrate, a p-type third film made of a semiconductor material having a composition substantially the same as that of the second semiconductor material and formed on each of the p-type source and drain regions, and a metal electrode formed on the third film, wherein an energy difference between a valence band of the third film and the vacuum level is smaller than an energy difference between a valence band of the p-type source and drain regions and the vacuum level;

wherein the first, second, and third films are derived from one film made of a semiconductor material having a composition substantially the same as that of the second semiconductor material.

2. A device according to claim 1, wherein an energy difference between a conduction band of the third film and the vacuum level is larger than an energy difference between a conduction band of the p-type source and drain regions and the vacuum level.

3. A device according to claim 2, wherein an energy difference between a valence band of the second film and the vacuum level is smaller than an energy difference between the valence band of the n-type source and drain regions and the vacuum level.

4. A device according to claim 3, wherein the bipolar transistor has a fourth film made of a semiconductor material having the same composition as that of the second semiconductor material and formed on a collector-contact region connected to the collector, and a metal electrode formed on the fourth film, and wherein the first, second, third, and fourth films are films derived from one film made of a semiconductor material having a composition substantially the same as that of the second semiconductor material.

5. A device according to claim 4, wherein the bipolar transistor is an npn transistor.

6. A device according to claim 1, wherein the first and second semiconductor materials are Si and $Si_x Ge_{1-x}$ ($0 \leq x < 1$), respectively.

7. A device according to claim 6, wherein an energy difference between a conduction band of the third film and the vacuum level is larger than an energy difference between a conduction band of the p-type source and drain regions and the vacuum level.

8. A device according to claim 7, wherein an energy difference between a valence band of the second film and a vacuum level is smaller than an energy difference between the valence band of the n-type source and drain regions and the vacuum level.

9. A device according to claim 8, wherein the bipolar transistor as a fourth film made of a semiconductor material having the same composition as that of the second semiconductor material and formed on a collector-contact region connected to the collector, and a metal electrode formed on the fourth film, and wherein the first, second, third, and fourth films are films derived from one film made of a semiconductor material having a composition substantially the same as that of the second semiconductor material.

10. A device according to claim 9, wherein the bipolar transistor is an npn transistor.

* * * * *